(12) United States Patent
Kikuta et al.

(10) Patent No.: US 7,154,158 B2
(45) Date of Patent: Dec. 26, 2006

(54) SEMICONDUCTOR DEVICE HAVING MIM STRUCTURE RESISTOR

(75) Inventors: Kuniko Kikuta, Kanagawa (JP); Makoto Nakayama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 242 days.

(21) Appl. No.: 10/964,623

(22) Filed: Oct. 15, 2004

(65) Prior Publication Data

US 2005/0082639 A1 Apr. 21, 2005

(30) Foreign Application Priority Data

Oct. 17, 2003 (JP) ............................. 2003-357877
Aug. 24, 2004 (JP) ............................. 2004-244321

(51) Int. Cl.
*H01L 29/00* (2006.01)

(52) U.S. Cl. ..................... 257/516; 257/533; 257/71; 257/351; 257/358; 257/363; 257/379; 257/E27.016; 257/E27.025; 257/E27.033

(58) Field of Classification Search ................ 257/71, 257/516, 533, 350, 351, 358, 360, 363, 379, 257/E27.016, E27.025, E27.033
See application file for complete search history.

(56) References Cited

U.S. PATENT DOCUMENTS

2003/0017699 A1 * 1/2003 Zurcher et al. ............. 438/687
2004/0087098 A1 * 5/2004 Ng et al. ..................... 438/381

FOREIGN PATENT DOCUMENTS

| JP | 1-223757 | 9/1989 |
|---|---|---|
| JP | 3-006858 | 1/1991 |
| JP | 5-013732 | 1/1993 |
| JP | 5-226340 | 9/1993 |
| JP | 9-139470 | 5/1997 |
| JP | 2001-267320 | 9/2001 |
| JP | 2002-033583 | 1/2002 |
| JP | 2003-152085 | 5/2003 |

* cited by examiner

*Primary Examiner*—Michelle Estrada
*Assistant Examiner*—Nicholas J. Tobergte
(74) *Attorney, Agent, or Firm*—Young & Thompson (57) ABSTRACT

As for the resistor on the semiconductor substrate, it is required to achieve obtaining a metal resistor, which can be formed in the latter half of a preliminary process for manufacturing a semiconductor, in addition to forming a polysilicon resistor, which is formed in the first half of the preliminary process. A capacitor having MIM structure comprises a lower electrode, a capacitive insulating film and an upper electrode, all of which are sequentially formed in this sequence. A resistor structure having MIM structure also comprises a lower electrode, a capacitive insulating film and a resistor, all of which are sequentially formed in this sequence. In this case, the biasing conditions thereof should be selected so that the resistor structure lower electrode of the MIM structure resistor is not coupled to any electric potential, and is in a floating condition. Therefore, even if the signal of higher frequency is applied to the metal resistor, the resistor structure lower electrode is hardly affected by the parasitic capacitance thereof due to its floating condition, thereby providing improved high frequency characteristics of the device including such metal resistor.

15 Claims, 10 Drawing Sheets

SEMICONDUCTOR DEVICE HAVING MIM STRUCTURE RESISTOR

This application is based on Japanese patent application No.2003-357877 and Japanese patent application No.2004-244321, the contents of which are incorporated hereinto by reference.

BACKGROUND OF THE INVENTION

1. Field of the Invention

The present invention relates to a semiconductor device, and particularly relates to a semiconductor device, which contains a capacitor and a resistor having metal-insulator-metal (MIM) structure.

2. Description of the Related Art

Resistors are frequently employed as passive elements in semiconductor integrated circuits. In particular, besides the diffused resistor formed in the semiconductor substrate, a polysilicon film and a metal film are deposited on an insulating film that covers the semiconductor substrate and patterned to form a structure, which can be employed as a resistor. In the case of the polysilicon resistor, the resistor is often formed simultaneously with forming the gate electrode of the transistor or the electrode of the capacitive element. In the case of the metal resistor, a film of a metal, which exhibits higher resistivity and is different from the material for the interconnects is deposited to form a resistor in order to increase the resistance, or, the resistor is formed simultaneously with forming the interconnects or the electrode of the capacitive element in order to prevent increasing the number of the process steps. The resistor is often formed by utilizing the film that is deposited to form the gate electrode of the transistor, the electrode of the capacitive element, an interconnect or the like, in order to prevent increasing the number of the process steps. For example, a structure of a resistor utilizing an upper electrode of a capacitor having MIM structure is disclosed in Japanese Patent Laid-Open No. 2001-267,320.

The structure disclosed in Japanese Patent Laid-Open No. 2001-267,320 are formed by a process, in which a metal film for a lower electrode of a capacitor is deposited and patterned to form a lower electrode, and then an insulator that would be a capacitive film and a metal film for an upper electrode are deposited, and the insulator and the metal film are simultaneously patterned. A resistor is formed by utilizing only the upper electrode and the insulator of the MIM structure capacitor. Further, a grounding interconnects are provided in the lower part of the resistor, sandwiching the insulating film, and thus a capacitive interference thereof with the grounding interconnects may possibly be caused. Therefore, such configuration may induce a considerable level of the parasitic capacitance between the resistor and the underlying interconnect, particularly in a higher frequency range, causing the resistor being impossible to be used in the higher frequency range.

SUMMARY OF THE INVENTION

The present invention has been conceived to solve the foregoing problem incidental to the prior art. There is provided a semiconductor device including a resistor and a capacitor having MIM structure mounted therein, and having improved high frequency characteristics.

According to the present invention, there is provided a semiconductor device comprising: a semiconductor substrate; a capacitor, which is provided on the semiconductor substrate and comprises a metal upper electrode, a metal lower electrode and a dielectric sandwiched by the metal upper electrode and the metal lower electrode; and a resistor structure provided on the semiconductor substrate, wherein the resistor structure comprises a metal upper electrode, a metal lower electrode and a dielectric sandwiched by the metal upper electrode and the metal lower electrode, all simultaneously formed with the capacitor, and further comprises two separated resistor terminals contacting with the metal upper electrode, thereby forming the metal upper electrode disposed between the two separated resistor terminals as a resistor.

The above-described semiconductor device according to the present invention may have a configuration, in which the metal lower electrode of the resistor structure has a floating potential.

The above-described semiconductor device according to an embodiment of the present invention may have a configuration, in which the metal lower electrode of the capacitor and the metal lower electrode of the resistor structure have geometries, in which the metal upper electrode of the capacitor and the metal upper electrode of the resistor structure are two-dimensionally included, respectively. In such configuration, the metal lower electrode of the capacitor may be coupled to a capacitor lower electrode pick-up interconnect, which is located upper than the metal upper electrode of the capacitor. In addition, a terminal for the upper electrode contacting with the metal upper electrode of the capacitor may be provided simultaneously with providing the two separated resistor terminals contacting with the metal upper electrode. Further, a terminal for the upper electrode contacting with the metal upper electrode of the capacitor and a terminal for the lower electrode contacting with the metal lower electrode of the capacitor may be provided simultaneously with providing the resistor terminal.

The above-described semiconductor device according to another embodiment of the present invention may have a configuration, in which the metal lower electrode, the dielectric and the metal upper electrode of the resistor structure may have a common two-dimensional geometry. Further, the metal lower electrode, the dielectric and the metal upper electrode of the capacitor may have a common two-dimensional geometry. Further, a terminal for the upper electrode contacting with the metal upper electrode of the capacitor may be provided simultaneously with providing the two separated resistor terminals contacting with the metal upper electrode.

In any of the above-described configurations, the metal lower electrode of the resistor and the metal lower electrode of the capacitor may be positioned at a same level as a level of one interconnect layer of multi-layered interconnects provided on the semiconductor substrate.

According to the semiconductor device of the present invention as described above, the capacitor having MIM structure is formed simultaneously with forming the resistor structure having MIM structure, and after providing a floating potential to the lower electrode of the resistor structure, the upper electrode is utilized to form a resistor. Thus, since the lower electrode of the resistor structure is a floating electrode, adverse effects of causing the parasitic capacitance in the resistor can be inhibited, thereby providing improved high frequency characteristics.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Emdodiment

Figure 1:
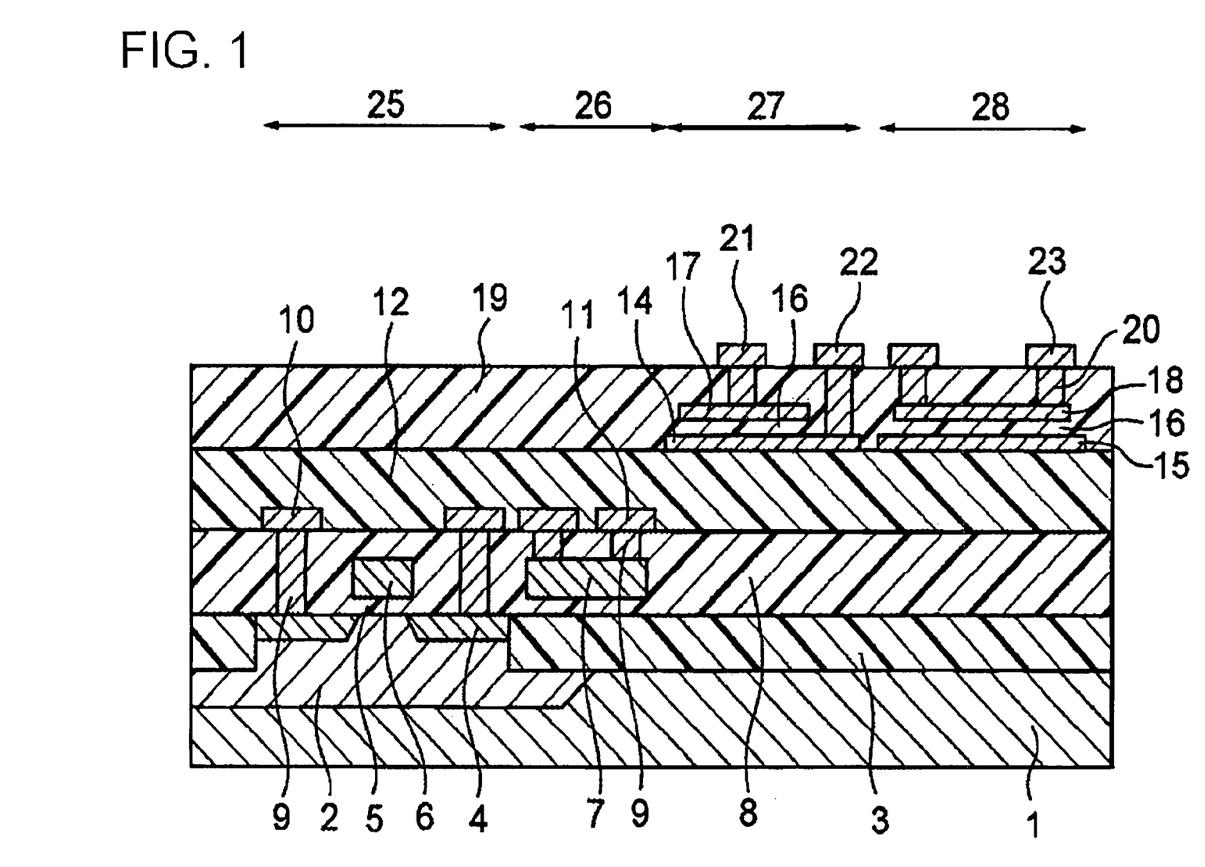
FIG. 1 is a cross sectional view of the resistor structure of the first embodiment of the present invention, also showing the MIM capacitor.

The first embodiment of the present invention will be described in reference to FIG. 1. In the first embodiment, a capacitor having MIM structure comprises a lower electrode (a metal lower electrode), a capacitive insulating film (a dielectric) and an upper electrode (a metal upper electrode), all of which are sequentially formed in this sequence. A resistor structure having MIM structure also comprises a lower electrode, a capacitive insulating film and a resistor, all of which are sequentially formed in this sequence. Here, in both structures, the lower electrode and the upper electrode are formed so that the lower electrode two-dimensionally includes the upper electrode. This is because the concern about causing the reliability problem is arisen when the multi-layered films comprising the lower electrode, the capacitive insulating film and the upper electrode, all of which are sequentially formed in this sequence, are simultaneously processed to have a common single pattern via, for example, an etching process, causing the situation where a capacitive insulating film of an end portion exposed to the etch atmosphere is used as a capacitor. Therefore, when the multi-layered films comprising the lower electrode, the capacitive insulating film and the upper electrode, all of which are sequentially formed in this sequence, are processed, only the upper electrode material is patterned first, and then the capacitive insulating film and the lower electrode material are patterned so as to include the patterned upper electrode material. More specifically, in considering the need to ensure at least the lithography-overlapping extra space for patterning at an end portion, it is desirable that the lower electrode should be formed to be wider than the upper electrode. For example, it is considered that the reliability problem is not arisen if the lower electrode is formed to be wider by 0.2 μm or more than the upper electrode. FIG. 1 is a cross sectional view of a semiconductor device along a cutting line passing a capacitor, a resistor structure, a transistor and a polysilicon resistor formed simultaneously with a gate electrode of the transistor.

The semiconductor device of the first embodiment comprises: a semiconductor substrate 1, a well 2, an isolation insulating film 3, a source drain diffused layer 4, a gate oxide film 5, a gate electrode 6, a polysilicon resistor 7, a first interlayer insulating film 8, first contact plugs (or, terminals) 9, source drain interconnect 10, a resistor interconnect 11, a second interlayer insulating film 12, a capacitor lower electrode 14, a resistor structure lower electrode 15, capacitive insulating films 16, a capacitor upper electrode 17, a metal resistor 18, a third interlayer insulating film 19, a third contact plug (or, terminal) 20, a capacitor upper electrode interconnect 21, a capacitor lower electrode interconnect 22 and a MIM structure resistor interconnect 23.

Here, the well 2, the source drain diffused layer 4, the gate oxide film 5, the gate electrode 6, the first contact plugs 9 and the source drain interconnect 10 compose the transistor 25; the polysilicon resistor 7, the first contact plug 9 and the resistor interconnect 11 compose the resistor 26; the capacitor lower electrode 14, the capacitive insulating film 16, the capacitor upper electrode 17, the third contact plug 20, the capacitor upper electrode interconnect 21 and the capacitor lower electrode interconnect 22 compose the capacitor 27; and the resistor structure lower electrode 15, the capacitive insulating film 16, the metal resistor (or, upper electrode resistor) 18, the third contact plug (or terminal) 20, and the MIM structure resistor interconnect 23 compose the MIM structure resistor 28.

The first contact plug 9 provided in the transistor 25 provides an electrical coupling between the source drain interconnect 10 and the gate electrode 6. The first contact plug 9 provided in the resistor 26 provides an electrical coupling between the resistor interconnect 11 and the polysilicon resistor 7. The third contact plug 20 provided in the capacitor 27 provides an electrical coupling between the MIM structure resistor interconnect 23 and the metal resistor 18. Further, the capacitor lower electrode interconnect 22 provides an electrically coupling between the capacitor lower electrode 14 and the upper interconnect (not shown in the drawings).

The capacitor 27 is composed of the capacitor upper electrode 17, the capacitor lower electrode 14 and the capacitive insulating film 16 that is sandwiched by these electrodes to function as a capacitive film. In the present embodiment, the capacitor lower electrode 14 has a portion that outwardly protrudes over the circumference edge of the capacitor upper electrode 17, and the protruded portion is joined to the capacitor lower electrode interconnect 22. Further, the capacitor upper electrode 17 is joined to the capacitor upper electrode interconnect 21.

The capacitor upper electrode 17 is composed of, for example, a barrier metal consisting of a refractory metal. Having such configuration, the capacitor upper electrode 17 can exhibit a function for the resistor of the upper electrode composing the MIM capacitor. Alternatively, TaN, Ta, W or the like may also be employed for the material composing the capacitor upper electrode 17, in stead of or in addition to TiN.

The capacitive insulating film 16 functions as a capacitive film of the capacitor. The capacitive insulating film 16 is composed of, for example, $SiO_2$, SiON, SiOC, SiN or the like.

In the present embodiment, the resistor structure lower electrode 15 is provided at a level equivalent to a level of the capacitor lower electrode 14, and composed of the same material and has the same thickness as the capacitor lower electrode 14. The resistor structure lower electrode 15 is designed to be at a floating potential, and thus does not function as a device.

The metal resistor 18 is provided at a level equivalent to the level of the capacitor upper electrode 17, and composed of the same material and has the same thickness as the capacitor upper electrode 17 in the present embodiment. The metal resistor 18 has a conformation that utilizes an upper electrode of a structure having the same structure as the capacitor 27 has, and more specifically utilizes the upper electrode as a resistor, which is coupled to the MIM structure resistor interconnect 23 through the third contact plug 20.

A pad for providing an external coupling may be provided in the interconnect layer that is provided with the capacitor upper electrode interconnect 21.

Figure 2:
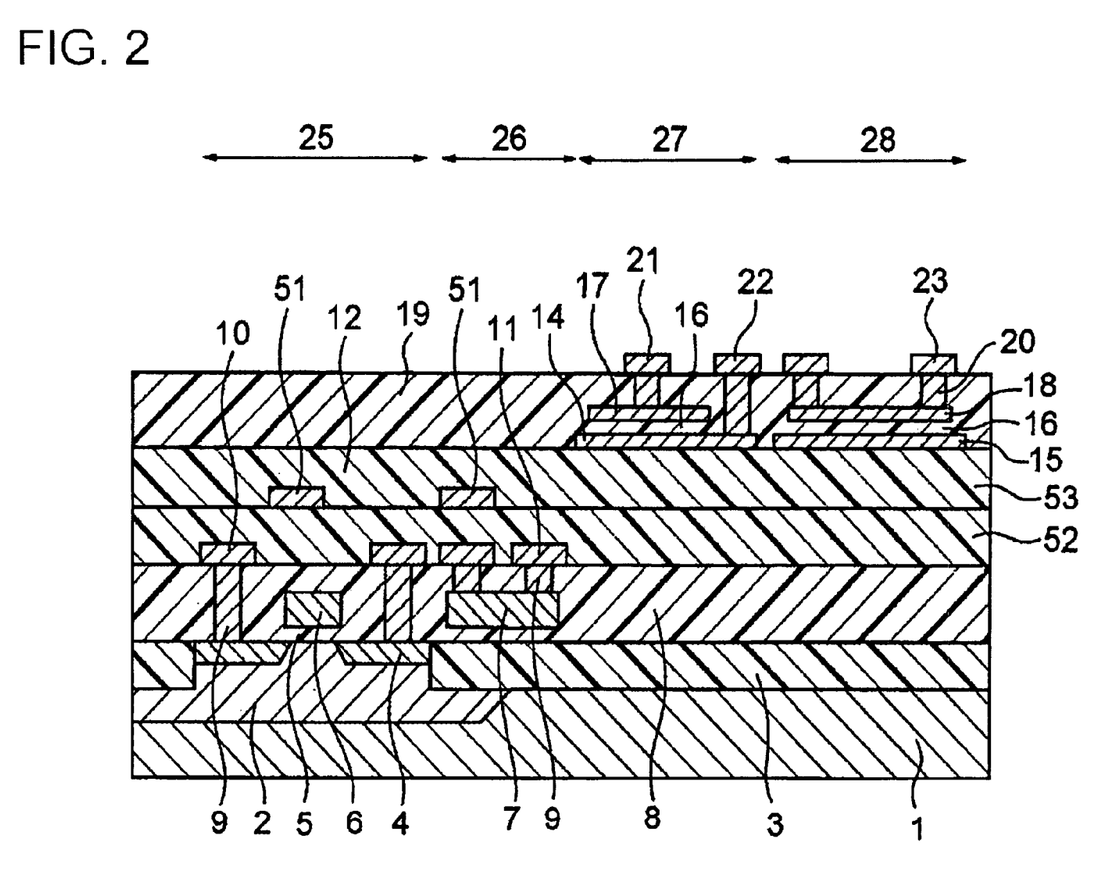
FIG. 2 is a cross sectional view of the resistor structure of the first embodiment of the present invention, showing the interconnect structure of a layer underlying a layer having the resistor structure of the first embodiment of the present invention formed with the MIM capacitor.

Although the second interlayer insulating film 12 is illustrated as a monolayer for the purpose of simplifying the description here, the second interlayer insulating film 12 may comprise a plurality of interlayer insulating films 52 and 53 (in the case of dual layer) that form or cover elements such as interconnect 51 or the like, as shown in FIG. 2. Insulating films, polysilicon films, metal films or the like that compose each of the above-described devices may be formed by utilizing methods known by a person having ordinary skills in the art.

Figure 3:
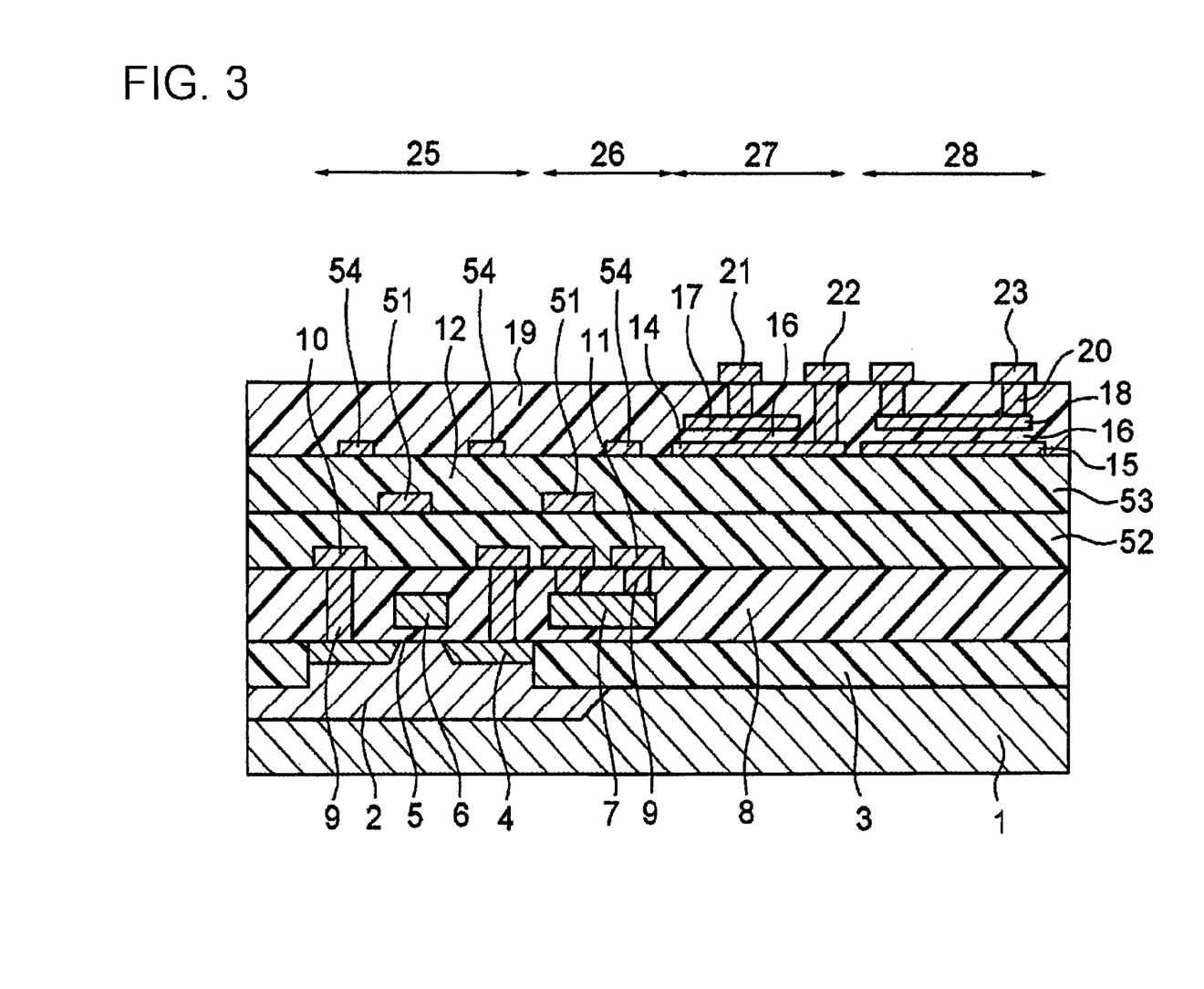
FIG. 3 is a cross sectional view of the resistor structure of the first embodiment of the present invention, showing an interconnect located at the level same as that of the lower electrode of the resistor structure of the first embodiment according to the present invention.

In addition, the capacitor lower electrode 14 and the resistor structure lower electrode 15 may have an interconnect 54 in the same layer of an area other than the capacitor 27 and the MIM structure resistor 28, as shown in FIG. 3. In this case, the capacitor lower electrode 14 and the resistor structure lower electrode 15 may be formed simultaneously with forming the interconnect 54.

A metal having lower resistivity may be employed for a specific material composing the capacitor lower electrode 14 and the resistor structure lower electrode 15. In particular, as shown in FIG. 3, when an interconnect is formed at the level same as the level of the capacitor lower electrode 14 and the resistor structure lower electrode 15, typical aluminum interconnect or copper interconnect, for example, are used. Although the metal having comparatively lower resistance is desirable for the upper electrode, the material such as, for example, TiN, Ta, TaN, W and the like may be used to obtain a resistor having a resistance of several tens O to several kilo O, in order to exhibiting the functions for a resistor by the resistor structure upper electrode 18. It is needless to say that these materials are disclosed for the purpose of the illustration only, and it is not intended that the resistor materials according to the present invention may be limited to these materials.

It should be noted that the biasing conditions of the semiconductor device including the MIM structure resistor 28 should be selected so that the resistor structure lower electrode 15 of the MIM structure resistor 28 is not coupled to any electric potential, and is in a floating condition. Therefore, even if the higher frequency signal is applied to the metal resistor 18, the resistor structure lower electrode 15 is hardly affected by the parasitic capacitance thereof due to its floating condition, thereby providing improved high frequency characteristics of the device having such metal resistor mounted thereon. In addition, although the polysilicon resistor 26 is located in vicinity of the semiconductor substrate 1, the distance between the MIM structure resistor 28 and the semiconductor substrate 1 can be longer since the lower electrode 15 of the resistor structure 28 includes a thicker insulating film containing a multi-layered interconnect underlying thereof, thereby reducing the parasitic capacitance between the resistor structure 28 and the semiconductor substrate 1.

Second Emdodiment

Figure 4:
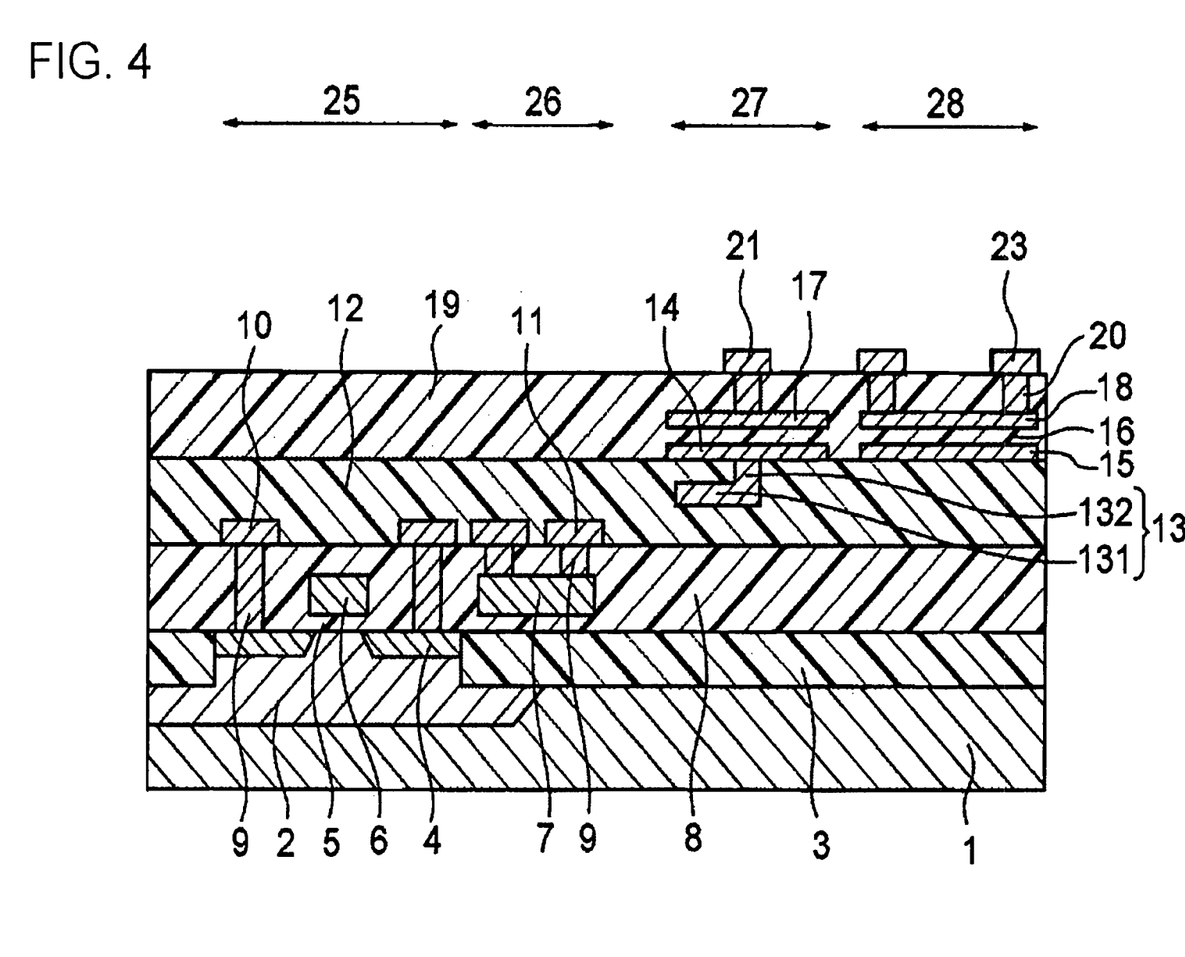
FIG. 4 is a cross sectional view of the resistor structure of the second embodiment of the present invention, also showing the MIM capacitor.

In the first embodiment, it has been illustrated that the MIM structure resistor has the two-dimensional geometries of the lower electrode and the upper electrode, which are different from that of the MIM structure capacitor. Therefore, two photo resist process steps are required for forming the lower electrode and the upper electrode of the MIM structure resistor and the MIM structure capacitor. Further, since the upper electrode and the lower electrode of the MIM structure capacitor are not symmetric, asymmetry may be generated, which, in turn, changes the characteristics thereof depending upon the manner of biasing the upper and the lower electrodes. On the contrary, since the second embodiment provides that each of the MIM structure resistor and the MIM structure capacitor has a single common two-dimensional geometry of the lower electrode and the upper electrode, the number of manufacturing process steps can be reduced to provide lower manufacturing cost, aside from the possibility of causing the problem on reliability described in the first embodiment. Here, since the upper electrode has a two-dimensional geometry same as that of the lower electrode, only the upper electrode can be seen when looking the upper electrode and the lower electrode down from the upper position, and only the lower electrode can be seen when looking them up from the lower position. More specifically, the upper electrode and the lower electrode have the same dimension, have the same coordinate positions in the transverse direction and in the longitudinal direction and have different coordinate position only in the vertical direction, provided that an arbitrary origin is given to provide a transverse, longitudinal and vertical axes in FIG. 4. FIG. 4 is a cross sectional view of a semiconductor device along a cutting line passing a capacitor, a resistor structure, a transistor and a polysilicon resistor formed simultaneously with a gate electrode of the transistor. Specifically, the MIM structure resistor and the MIM structure capacitor have the following structures.

A semiconductor substrate 1, a well 2, an isolation insulating film 3, a source drain diffused layer 4, a gate oxide film 5, a gate electrode 6, a polysilicon resistor 7, a first interlayer insulating film 8, first contact plugs 9, source drain interconnect 10, a resistor interconnect 11, and a second interlayer insulating film 12 are provided similarly as in the fist embodiment.

Then, a capacitor lower electrode interconnect (drawing electrode) 131 and a capacitor lower electrode plug 132 are formed onto the second interlayer insulating film 12 to form a lower electrode pick-up interconnect 13. Although the illustrated capacitor lower electrode interconnect 131 is shown as having a broken-off form in the annexed figure, the capacitor lower electrode interconnect 131 is actually coupled to other element or other interconnects.

Thereafter, a capacitor lower electrode 14, a resistor structure lower electrode 15, a capacitive insulating film 16, a capacitor upper electrode 17, a metal resistor 18, a third interlayer insulating film 19, a third contact plug (or terminal) 20, a capacitor upper electrode interconnect 21 and a MIM structure resistor interconnect 23 are provided.

Here, the well 2, the source drain diffused layer 4, the gate oxide film 5, the gate electrode 6, the first contact plugs 9 and the source drain interconnect 10 compose the transistor 25; the polysilicon resistor 7, the first contact plug 9 and the resistor interconnect 11 compose the resistor 26; the lower electrode pick-up interconnect 13, the capacitor lower electrode 14, the capacitive insulating film 16, the capacitor upper electrode 17, the third contact plug (or terminal) 20 and the capacitor upper electrode interconnect 21 compose the capacitor 27; and the resistor structure lower electrode 15, the capacitive insulating film 16, the metal resistor (or, upper electrode resistor) 18, the third contact plug (or terminal) 20, and the MIM structure resistor interconnect 23 compose the MIM structure resistor 28. Although the second interlayer insulating film 12 is illustrated as a monolayer for the purpose of simplifying the description here, the second interlayer insulating film 12 may comprise a plurality of interlayer insulating films that cover elements such as interconnect, similarly as in the first embodiment. Insulating films, polysilicon films, metal films or the like that compose each of the above-described devices may be formed by utilizing methods known by a person having ordinary skills in the art.

It is in the same situation as in the first embodiment that the resistor structure lower electrode 15 of the MIM structure resistor 28 is not coupled to any electric potential, and is designed to be in a floating condition. Therefore, even if the signal of higher frequency is applied to the metal resistor 18, the resistor structure lower electrode 15 is hardly affected by the parasitic capacitance thereof due to its floating condition, thereby providing improved high frequency characteristics of the device having such metal resistor mounted thereon.

The embodiments of the present invention have been described in reference to the annexed figures, and it should be understood that these are the illustrations of the present invention, and the various configurations other than the above-described configurations can also be presented within the scope of the invention.

Figure 5:
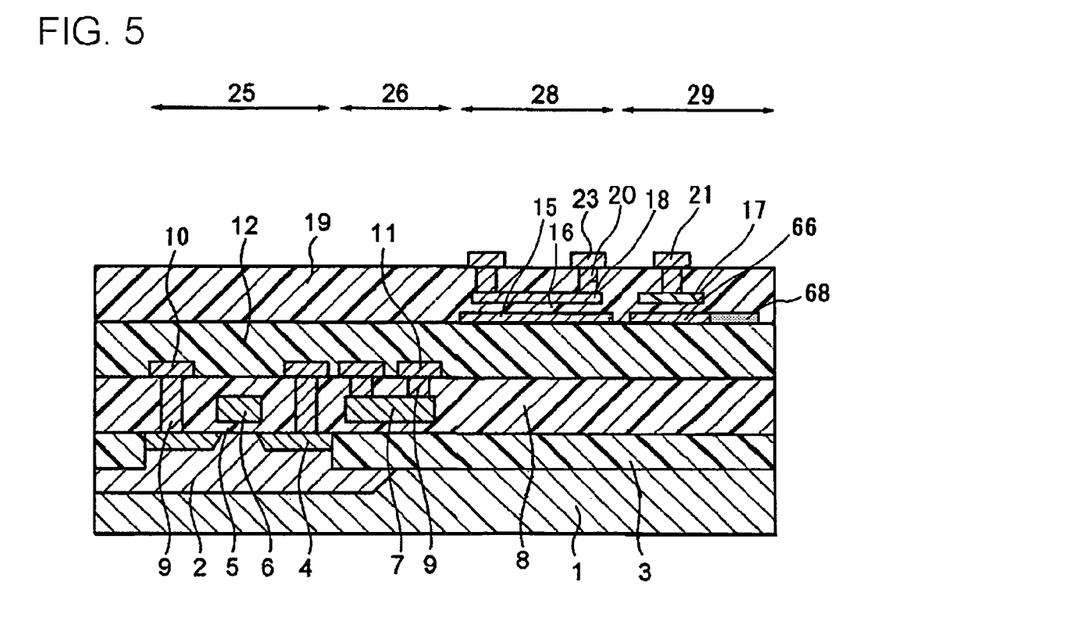
FIG. 5 is a cross sectional view of the resistor structure of the modified embodiment, for describing the structure of the semiconductor device according to the modified embodiments.
Figure 6A:
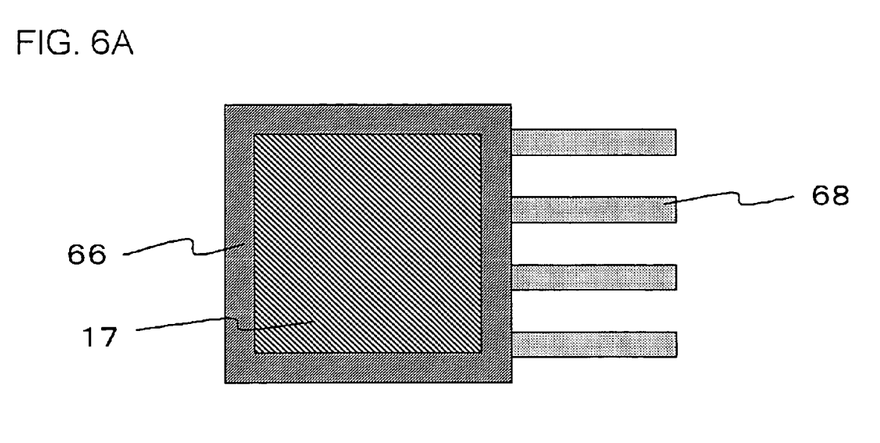
FIGS. 6A and 6B are plan views of the capacitor upper electrode, for describing the structure of the lower electrode according to the modified embodiment.
Figure 6B:
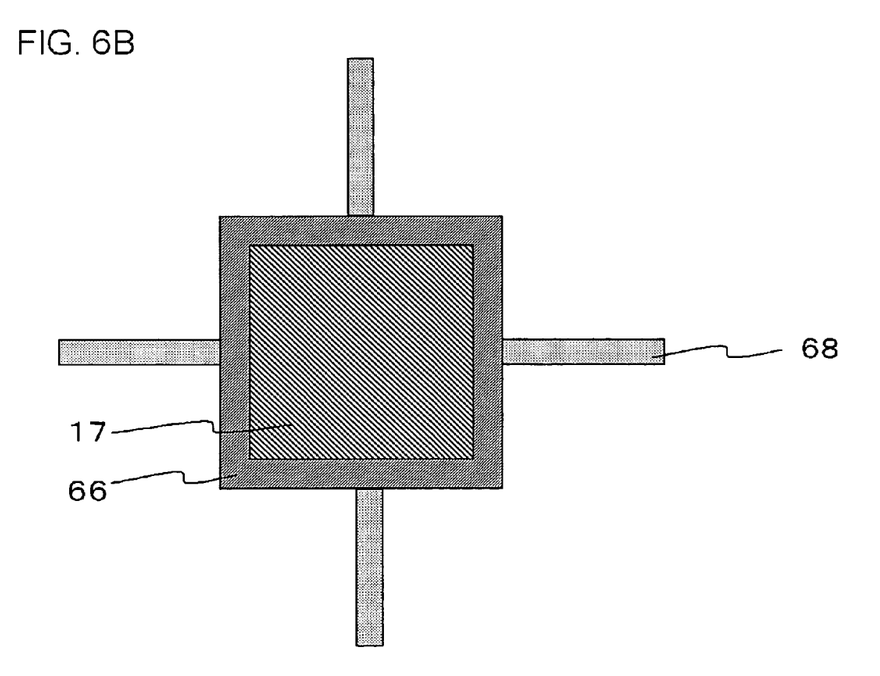

For example, as shown in FIG. 5, a capacitor 29, which is provided so as to be coupled to the capacitor lower electrode 66 and has an drawing interconnect 68 to be located at the same level as that of the capacitor lower electrode 66, may be provided. Here, the term "be located at the same level" means that the capacitor lower electrode 66 is provided in an interconnect layer that also includes the drawing interconnect 68, and as shown in FIG. 5, that the capacitor lower electrode 66 has the same height as the drawing interconnect 68 has. Having such configuration, the area of the capacitor lower electrode 66 can be reduced, in comparison with the conformation that is provided with a contact to provide an electrical coupling to the drawing interconnect of the upper layer. Therefore, the parasitic capacitance generated between the capacitor lower electrode 66 and the semiconductor substrate 1 can be further reduced, thereby providing the capacitor 29 having more stable high frequency characteristics. In this case, the width of the drawing interconnect 68 is preferably narrower than the width of one side of the capacitor lower electrode 66. Because this configuration can effectively reduce the generation of the deviation in the electric potential distribution in the capacitor lower electrode 66, thereby further reducing the parasitic capacitance generated between the drawing interconnect 68 and the semiconductor substrate 1. Further, the electrical coupling of the capacitor lower electrode 66 to the drawing interconnect 68 may be achieved by providing the drawing interconnect 68 drawn from one side of the capacitor lower electrode 66 as shown in FIG. 6A, or drawn from four sides thereof as shown in FIG. 6B. Alternatively, the electrical coupling may also be achieved by providing the drawing interconnect 68 drawn from two sides or three sides of the capacitor lower electrode 66, though it is not shown. Further, only one drawing interconnect 68 may be drawn, or a plurality of the drawing interconnects 68 may be drawn, from one side of the capacitor lower electrode 66. Further the drawing interconnects 68 may be drawn from the vicinity of the edge of the side of the capacitor lower electrode 66, or from other positions such as a position in vicinity of the central part of the side thereof.

Figure 7A:
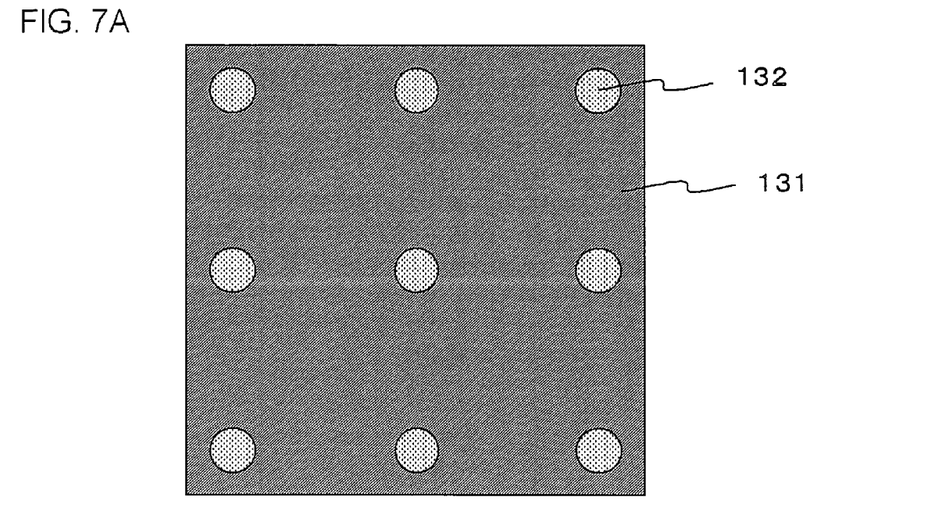
FIGS. 7A and 7B are plan views of the capacitor lower electrode interconnect, for describing the structure of the lower electrode according to the modified embodiment.
Figure 7B:
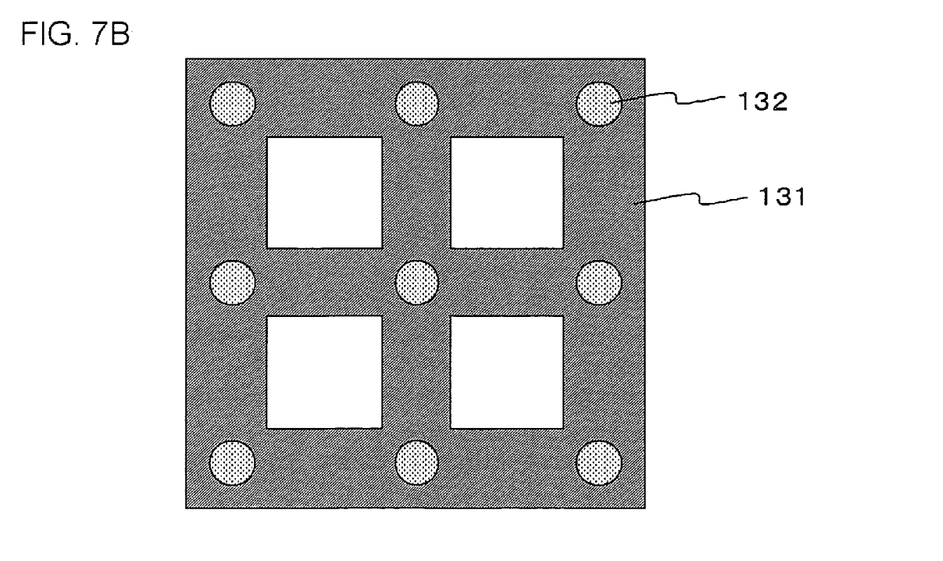

In addition, the geometry of the capacitor lower electrode interconnect (drawing electrode) 131 underlying the capacitor lower electrode 14 shown in FIG. 4 may be a flat plate shape as shown in FIG. 7A or a lattice shape as shown in FIG. 7B. Here, the lattice shape of the capacitor lower electrode interconnect 131 means a shape of, for example as shown in FIG. 7B, having electrodes left within an inner area enclosed by the four sides of the a square and within a circumference area of the lines which join a pair of midpoints of the opposite side lines thereof, and the contacts are provided at the portions of the left electrodes. In case of the lattice shape, the area of the capacitor lower electrode interconnect 131 can be designed to be narrower than the area of the capacitor lower electrode 14. Therefore, the parasitic capacitance generated between the capacitor lower electrode interconnect 131 and the semiconductor substrate 1 can be further reduced. Further, even in the case of having the shapes thereof other than the lattice shape, the above-mentioned advantageous effect can be obtained if the capacitor lower electrode interconnect 131 has a geometry having smaller area than the area of capacitor lower electrode 14.

In addition, contacts for coupling the capacitor lower be provided to be arranged at generally even spacings. Having such configuration, the capacitor can be formed to be symmetric, thereby obtaining more stable design. Therefore, the capacitor having more stable high frequency characteristics can be obtained. Here, the term "at generally even spacings" means that an error of the spacing between the contacts within a range for providing a symmetry of the capacitor and obtaining more stable design thereof, is permitted.

Figure 8A:
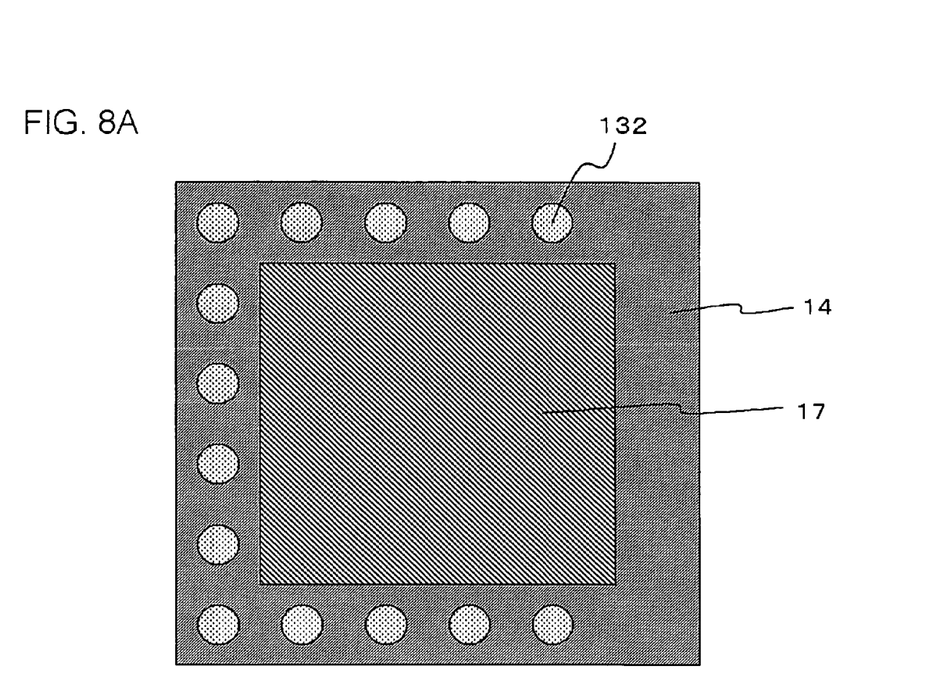
FIGS. 8A and 8B are plan views of the capacitor upper electrode, for describing the structure of the lower electrode according to the modified embodiment.
Figure 8B:
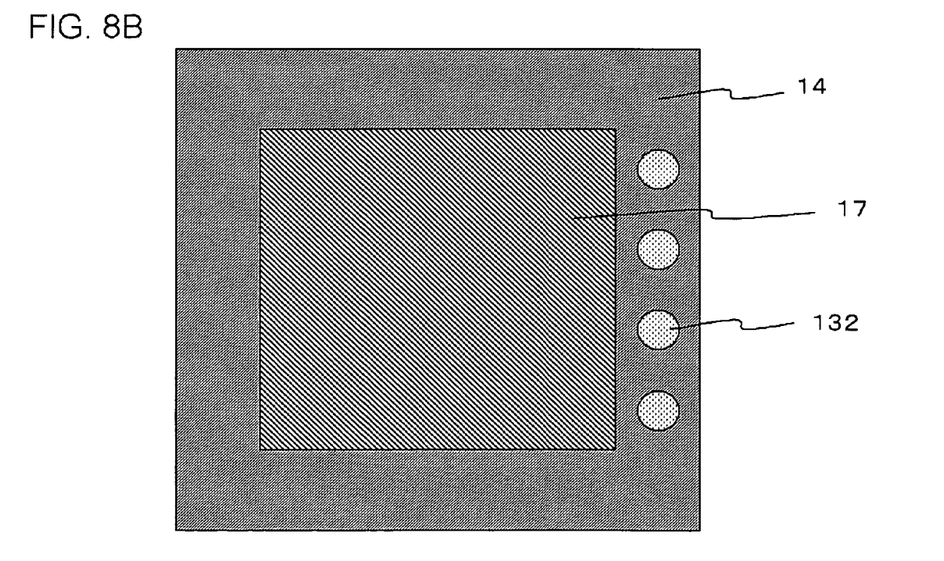

In addition, capacitor lower electrode plug (contact) 132 for coupling the capacitor lower electrode 14 and the capacitor lower electrode interconnect 22 may be arranged to be disposed in an inverse-horseshoe shape along the interior of three sides of the capacitor lower electrode 14 as shown in FIG. 8, or arranged to be linearly disposed within the inside of one side of the capacitor lower electrode 14. In addition, the capacitor lower electrode 14 and the capacitor lower electrode interconnect 22 may be coupled via one capacitor lower electrode plug (contact).

In addition, capacitor lower electrode plugs (contacts) 132 may be provided to be arranged at generally even spacings. Having this configuration, the capacitor can be formed to be symmetric, thereby obtaining more stable design. Therefore, the capacitor having more stable high frequency characteristics can be obtained.

Figure 9:
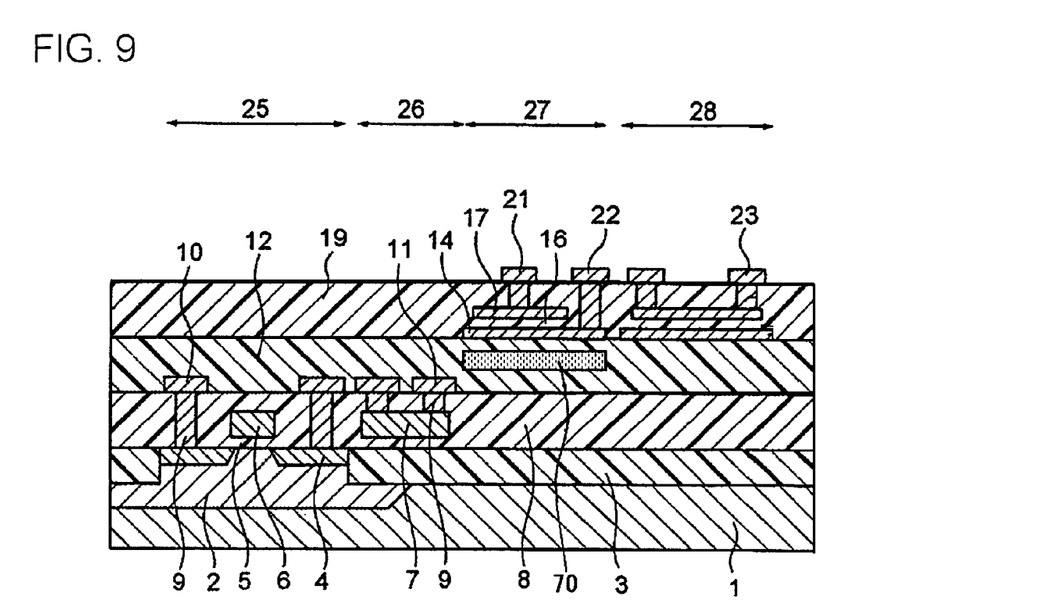
FIG. 9 is a cross sectional view of the resistor structure of the modified embodiment, for describing the structure of the semiconductor device according to the modified embodiments.
Figure 10A:
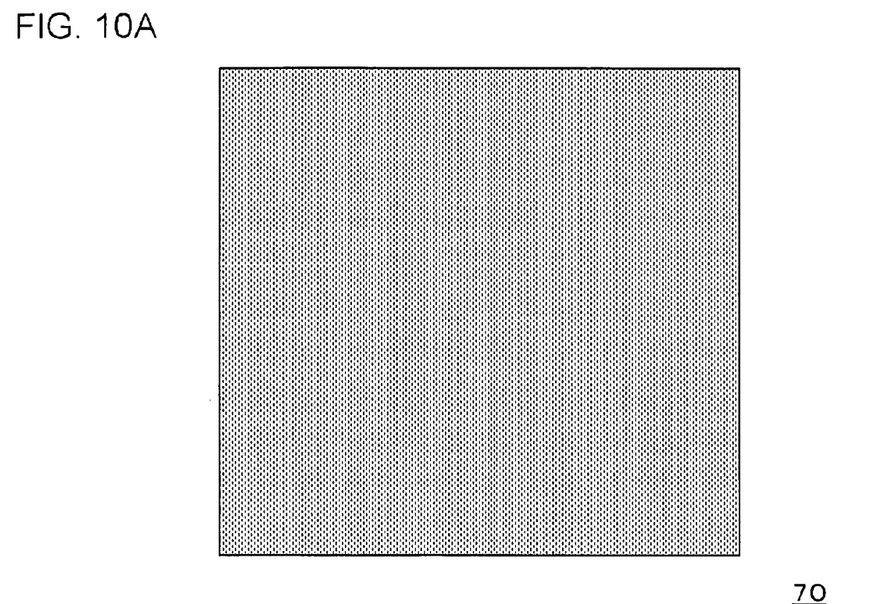
FIGS. 10A and 10B are plan views of the shield electrode, for describe structure of the semiconductor device according to the modified embodiment.
Figure 10B:
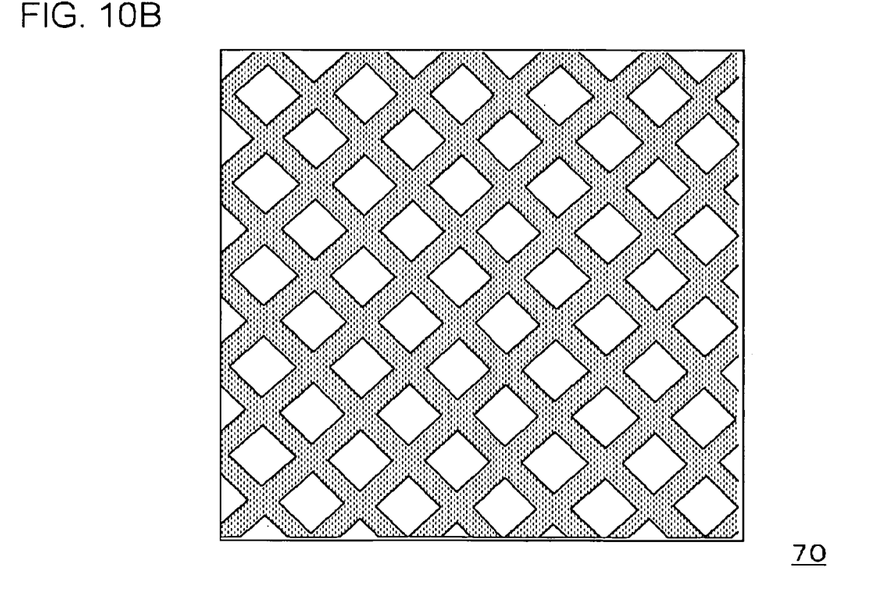

In addition, a shield electrode 70 having a floating potential disposed under the capacitor lower electrode 14 may be provided, as shown in FIG. 9. The parasitic capacitance generated between the capacitor lower electrode 14 and the semiconductor substrate 1 can further be reduced by the presence of the shield electrode 70. The geometry of the shield electrode 70 may be a flat plate shape or a mesh shape, as shown in FIGS. 10A and 10B, respectively. In the case of the mesh shape shown in FIG. 10B, the area of the shield electrode 70 can be designed to be narrower than the area of the capacitor lower electrode 14. Thus, the parasitic capacitance generated between the capacitor lower electrode 14 and the semiconductor substrate 1 can further be reduced. Further, the shield electrode 70 may be grounded. Having such configuration, the shield electrode 70 has a fixed electric potential, thereby more stably reducing the parasitic capacitance generated between the shield electrode 70 and the semiconductor substrate 1.

Further, an interconnect employed as an electric fuse may be provided at a level same as that of the capacitor upper electrode interconnect layer 21. In this case, the interconnect layer is composed with a metal such as TiN, aluminum and the like.

It is apparent that the present invention is not limited to the above embodiment, that may be modified and changed without departing from the scope and spirit of the invention.

What is claimed is:

1. A semiconductor device comprising:
  a semiconductor substrate;
  a capacitor, which is provided on said semiconductor substrate and comprises a metal upper electrode, a metal lower electrode and a dielectric sandwiched by said metal upper electrode and said metal lower electrode; and
  a resistor structure provided on said semiconductor substrate,
  wherein said resistor structure comprises a metal upper electrode, a metal lower electrode and a dielectric sandwiched by said metal upper electrode and said metal lower electrode, all simultaneously formed with said capacitor, and further comprises two separated resistor terminals contacting with said metal upper electrode, thereby forming said metal upper electrode disposed between said two separated resistor terminals as a resistor.

2. The semiconductor device according to claim 1, wherein said metal lower electrode of said resistor structure has a floating potential.

3. The semiconductor device according to claim 1, wherein said metal lower electrode of the capacitor and said metal lower electrode of the resistor structure have geometries, in which said metal upper electrode of the capacitor and said metal upper electrode of the resistor structure are two-dimensionally included, respectively.

4. The semiconductor device according to claim 1, wherein said metal lower electrode of the capacitor is coupled to a capacitor lower electrode pick-up interconnect, which is located upper than said metal upper electrode of the capacitor.

5. The semiconductor device according to claim 1, wherein said metal lower electrode, said dielectric and said metal upper electrode of the resistor structure have a common two-dimensional geometry.

6. The semiconductor device according to claim 1, wherein said metal lower electrode, said dielectric and said metal upper electrode of the capacitor have a common two-dimensional geometry.

7. The semiconductor device according to claim 1, wherein a terminal for the upper electrode contacting with said metal upper electrode of said capacitor is provided simultaneously with providing said two separated resistor terminals contacting with said metal upper electrode.

8. The semiconductor device according to claim 1, wherein a terminal for the upper electrode contacting with said metal upper electrode of the capacitor and a terminal for the lower electrode contacting with said metal lower electrode of the capacitor are provided simultaneously with providing said resistor terminal.

9. The semiconductor device according to claim 1, wherein said metal lower electrode of the resistor and said metal lower electrode of the capacitor are positioned at a same level as a level of one interconnect layer of multi-layered interconnects provided on said semiconductor substrate.

10. The semiconductor device according to claim 1, further comprising a drawing electrode provided to couple to said metal lower electrode and positioned at a same level as a level of said lower electrode.

11. The semiconductor device according to claim 1, further comprising a drawing electrode provided to contact said metal lower electrode and positioned under said metal lower electrode, wherein said drawing electrode has an area, which is narrower than an area of said metal lower electrode.

12. The semiconductor device according to claim 11, wherein a geometry of said drawing electrode is a lattice shape.

13. The semiconductor device according to claim 11, further comprising contacts for coupling said drawing electrode and said metal lower electrode, said contacts being provided on an upper surface of said metal lower electrode to be arranged at generally even spacings.

14. The semiconductor device according to claim 1, further comprising a shield electrode under said metal lower electrode, wherein said shield electrode has a floating potential.

15. The semiconductor device according to claim 14, wherein said shield electrode is grounded.

* * * * *